United States Patent
Yu et al.

(10) Patent No.: US 8,253,177 B2
(45) Date of Patent: Aug. 28, 2012

(54) STRAINED CHANNEL TRANSISTOR

(75) Inventors: Ming-Hua Yu, Jhubei (TW); Tai-Chun Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/714,001

(22) Filed: Feb. 26, 2010

(65) Prior Publication Data

US 2010/0151648 A1 Jun. 17, 2010

Related U.S. Application Data

(63) Continuation of application No. 11/847,083, filed on Aug. 29, 2007, now Pat. No. 7,700,452.

(51) Int. Cl.
*H01L 29/78* (2006.01)
(52) U.S. Cl. .................. 257/288; 257/E29.27
(58) Field of Classification Search .............. 438/151, 438/197, 280, 282, 303, 305, 585; 257/282, 257/E21.431, E29.266, 288
See application file for complete search history.

(56) References Cited

U.S. PATENT DOCUMENTS

| | | | |
|---|---|---|---|
| 6,124,614 A | 9/2000 | Ryum et al. | |
| 6,252,295 B1 * | 6/2001 | Cote et al. | 257/635 |
| 6,274,894 B1 | 8/2001 | Wieczorek et al. | |
| 6,563,152 B2 | 5/2003 | Roberds et al. | |
| 6,605,498 B1 * | 8/2003 | Murthy et al. | 438/197 |
| 6,787,793 B2 | 9/2004 | Yoshida | |
| 6,825,086 B2 | 11/2004 | Lee et al. | |
| 6,858,506 B2 | 2/2005 | Chang | |
| 2001/0037760 A1 | 11/2001 | Solomon et al. | |
| 2006/0084247 A1 | 4/2006 | Liu | |
| 2006/0115933 A1 | 6/2006 | Ye et al. | |
| 2006/0148151 A1 * | 7/2006 | Murthy et al. | 438/197 |
| 2006/0186484 A1 * | 8/2006 | Chau et al. | 257/401 |
| 2006/0220113 A1 | 10/2006 | Tamura et al. | |
| 2006/0237746 A1 | 10/2006 | Orlowski et al. | |
| 2006/0260538 A1 | 11/2006 | Ye et al. | |
| 2006/0292878 A1 | 12/2006 | Hara | |
| 2007/0020864 A1 | 1/2007 | Chong et al. | |
| 2007/0096148 A1 | 5/2007 | Hoentschel et al. | |
| 2007/0096149 A1 | 5/2007 | Liu et al. | |
| 2009/0047760 A1 * | 2/2009 | Yamazaki et al. | 438/158 |

OTHER PUBLICATIONS

Synopsys, Inc., Presentation, 2 pages, 2005.

* cited by examiner

*Primary Examiner* — Julio J Maldonado
*Assistant Examiner* — Daniel Shook
(74) *Attorney, Agent, or Firm* — Slater & Matsil, L.L.P.

(57) ABSTRACT

A semiconductor device, such as a PMOS or an NMOS transistor, having a stressed channel region is provided. The semiconductor device is formed by recessing the source/drain regions after forming a gate stack. The substrate is removed under the gate stack. Thereafter, an epitaxial layer is formed under the gate stack and in the source/drain regions. The epitaxial layer may be doped in the source/drain regions. In an embodiment, a lower portion of the epitaxial layer and the epitaxial layer under the gate stack may be doped with a conductivity type opposite of the conductivity type of the source/drain regions. In another embodiment of the present invention, a lower portion of the epitaxial layer is left undoped.

20 Claims, 6 Drawing Sheets

STRAINED CHANNEL TRANSISTOR

This application is a continuation of U.S. patent application Ser. No. 11/847,083, entitled "Strained Channel Transistor," filed on Aug. 29, 2007, which application is incorporated herein by reference.

TECHNICAL FIELD

The present invention relates generally to semiconductor devices, and, more particularly, to metal-oxide-semiconductor field-effect transistors and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches for introducing strain in the transistor channel region.

In one approach, strain in the channel is introduced by forming a stress layer, such as silicon germanium, over a silicon substrate. The difference in the lattice structure between the silicon substrate and the overlying silicon germanium creates a stress layer, thereby creating stress in the channel region of a subsequently formed transistor.

In this approach, a silicon capping layer is frequently formed over the silicon germanium to prevent the formation of germanium oxide and to aid in the formation of a gate oxide. The process of forming the silicon capping layer, however, is difficult to control. Furthermore, a silicon germanium oxide may nonetheless form during the process of forming the gate oxide. The silicon germanium oxide often exhibits a high interface state density (Dit) and bulk traps, thereby decreasing the performance of the transistor.

Accordingly, there is need for a method to induce strain in the channel region such that the performance characteristics of transistors are enhanced.

SUMMARY OF THE INVENTION

These and other problems are generally reduced, solved or circumvented, and technical advantages are generally achieved, by embodiments of the present invention, which provides a strained semiconductor device to improve the operating characteristics of the semiconductor device and a method of manufacture therefor.

In accordance with an embodiment of the present invention, a method of forming a semiconductor device having a stressed channel region is provided. The semiconductor device may be formed by forming a gate dielectric and a gate electrode on a substrate. The substrate is recessed on opposing sides of the gate electrode and under the gate electrode. An epitaxial layer is then formed in the recess. The epitaxial layer may be doped to form source/drain regions. A lower portion of the epitaxial layer and the epitaxial layer under the gate electrode may be undoped or doped to have a conductivity opposite the source/drain regions.

In accordance with another embodiment of the present invention, another method of forming a semiconductor device having a stressed channel region is provided. The semiconductor device is formed by forming a gate stack on the substrate. Thereafter, a recess is formed in the source/drain regions and below the gate stack such that the substrate has a raised surface below the gate stack. An epitaxial layer is formed in the recess, substantially filling the recess below the gate stack. Thereafter, source/drain regions are formed on opposing sides of the gate stack. A lower portion of the epitaxial layer and the epitaxial layer under the gate electrode may be undoped or doped to have a conductivity opposite the source/drain regions.

In accordance with yet another embodiment of the present invention, another method of forming a semiconductor device having a stressed channel region is provided. The method includes forming a gate stack on a substrate. The substrate in the source/drain regions is recessed and the gate stack is tunneled under, thereby creating a tunnel below the gate stack. Thereafter, the recess is filled with a layer having a different lattice structure than the substrate, and the source/drain regions are formed. A lower portion of the layer and the layer under the gate electrode may be undoped or doped to have a conductivity opposite the source/drain regions.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
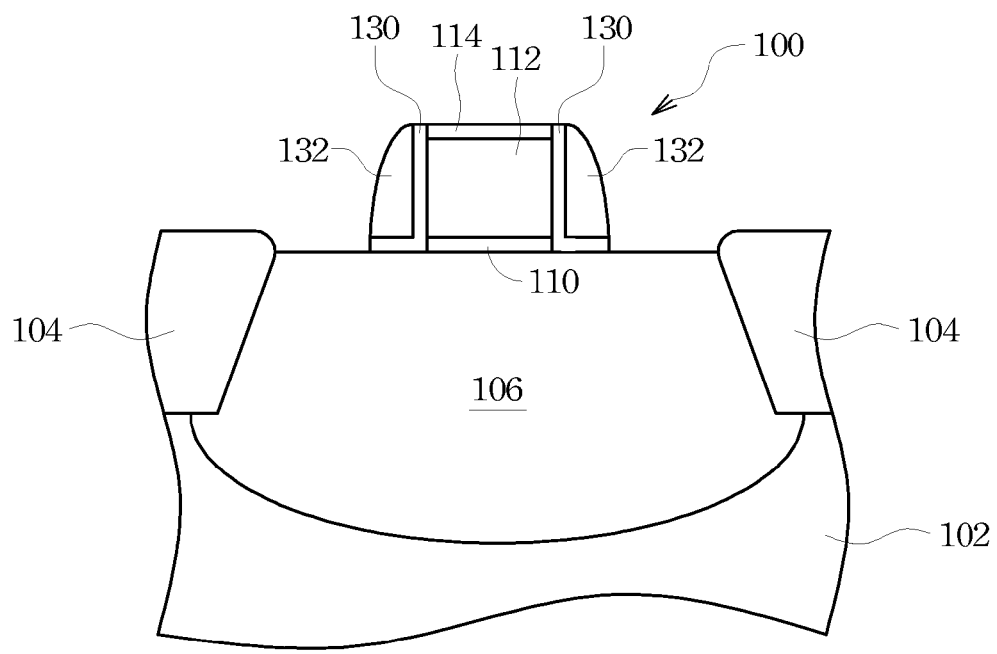
FIGS. 1-5 illustrate various process steps for fabricating a semiconductor device having a stressed channel region in accordance with an embodiment of the present invention.

FIGS. 1-5 illustrate a method embodiment for fabricating a semiconductor device 100 having a strained channel region in accordance with an embodiment of the present invention. Embodiments of the present invention illustrated herein may be used in a variety of circuits. Referring first to FIG. 1, a portion of a substrate 102 having shallow trench isolations (STIs) 104 formed therein is shown in accordance with an embodiment of the present invention. The substrate 102 may comprise bulk silicon, doped or undoped. In a preferred embodiment, the substrate 102 comprises a bulk silicon having a <100> crystal orientation.

In other embodiments, the substrate 102 may be an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. The STIs 104 may comprise silicon oxide deposited by chemical vapor deposition (CVD) techniques. Other isolation structures, such as a thermally grown field oxide (FOX) region or the like, and other materials may also be used.

Also illustrated in FIG. 1 is an optional deep well 106 to provide additional isolation for devices formed therein. For a PMOS device, the deep well 106 may be a deep N-well formed by implanting or diffusing an N-type ion, such as arsenic or phosphorous ions, into the substrate 102. For an NMOS device, the deep well 106 may be a deep P-well formed by implanting or diffusing a P-type ion, such as boron ions, into the substrate 102.

A gate insulator layer 110, a gate electrode 112, and a hard mask 114 are formed and patterned on the substrate 102 as illustrated in FIG. 1. The gate insulator layer 110 is preferably a high-K dielectric material, such as silicon oxide, silicon oxynitride, silicon nitride, an oxide, a nitrogen-containing oxide, a combination thereof, or the like. Preferably, the gate insulator layer 110 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate insulator layer 110 comprises an oxide layer, the gate insulator layer 110 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, the gate insulator layer 110 is about 10 Å to about 50 Å in thickness, but more preferably about 15 Å in thickness.

The gate electrode 112 preferably comprises a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof. In one example, amorphous silicon is deposited and recrystallized to create poly-crystalline silicon (poly-silicon). In the preferred embodiment in which the gate electrode 112 is poly-silicon, the gate electrode 112 may be formed by depositing doped or undoped poly-silicon by low-pressure chemical vapor deposition (LPCVD) to a thickness in the range of about 200 Å to about 1000 Å, but more preferably from about 600 Å to about 800 Å.

The hard mask 114 may comprise any suitable material to protect the underlying gate electrode 112 during subsequent processing. In an embodiment, the hard mask 114 comprises an oxide or a nitride, such as silicon oxide, silicon oxynitride, silicon nitride, or the like, deposited via LPCVD or via plasma enhanced chemical vapor deposition (PECVD) procedures to a thickness between about 200 Å and about 1000 Å. Other materials and thicknesses may be used.

The gate insulator layer 110 and the gate electrode 112 may be formed by depositing blanket layers and patterning the blanket layers using photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate insulator layer 110 and the gate electrode 112 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

In an embodiment, liners 130 and a first set of spacers 132 are formed alongside the gate electrode 112. The liners 130 and the first set of spacers 132 may be formed by depositing and patterning a first dielectric layer and a second dielectric layer. The first dielectric layer, corresponding to the liners 130, may comprise silicon dioxide formed by LPCVD techniques using TEOS and oxygen as a precursor. Other materials, such as, for example, silicon oxynitride, silicon, a combination thereof, or the like, may also be used. In the preferred embodiment, the liners 130 are about 10 Å to about 150 Å in thickness, but more preferably about 100 Å in thickness.

The second dielectric layer preferably comprises silicon nitride ($Si_3N_4$) that has been formed using CVD techniques using silane and ammonia as precursor gases. Other materials, such as a nitrogen containing layer other than $Si_3N_4$, such as $Si_xN_y$, silicon oxynitride $SiO_xN_y$, or a combination thereof, may also be used. In the preferred embodiment, the second dielectric layer is about 50 Å to about 200 Å in thickness.

The second dielectric layer may be patterned to form the first set of spacers 132. In the preferred embodiment in which the second dielectric layer is $Si_3N_4$, the second dielectric layer may be patterned by performing an anisotropic dry etch process. It should be noted that the materials for the second dielectric layer and the first dielectric layer are selected such that a high etch selectivity exists between the two materials. In this manner, one layer is relatively unaffected while etching or removing the other layer. The first dielectric layer may be patterned, for example, by performing a timed isotropic wet etch process using a solution of diluted hydrofluoric acid to form the liners 130 as illustrated in FIG. 1.

Figure 2:
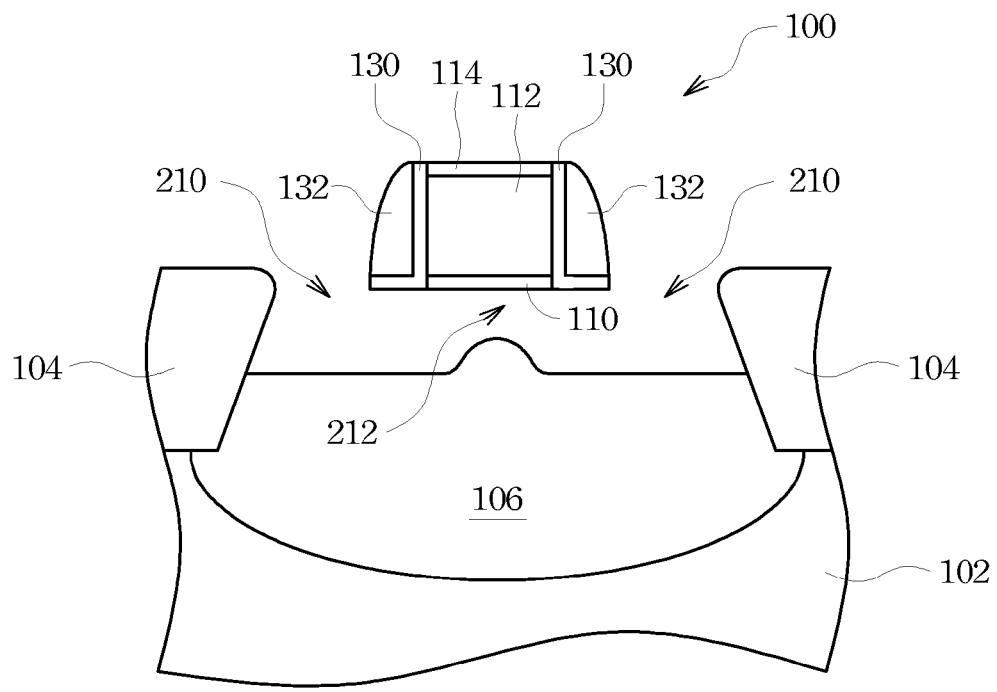

Referring now to FIG. 2, the semiconductor device 100 is shown after an etching process has been performed to create a recessed region 210 in the substrate 102 on either side of the gate electrode 112 in accordance with an embodiment of the present invention. The recessed region 210 may be formed by, for example, first performing an anisotropic etch to recess the substrate 102 to a desired depth and then performing a lateral isotropic etch to laterally recess the substrate 102 under the gate electrode 112.

In an embodiment, an anisotropic etch is performed using a reactive ion etch (RIE) process to recess the substrate 102 to a depth from about 600 Å to about 800 Å. Thereafter, an isotropic etch process is performed that laterally etches the substrate 102 under the gate electrode 112, thereby resulting in a "tunnel" 212 in the channel region as illustrated in FIG. 2. Due to the isotropic etch properties, the substrate 102 under the gate electrode 112 and the gate dielectric 110 may be raised such that the substrate 102 is recessed to a greater depth in the source/drain regions than directly under the gate electrode 112 and the gate dielectric 110. In an embodiment, the substrate 102 is recessed from about 0 Å to about 1000 Å under the gate electrode 112 and the gate dielectric 110. The lateral etch process may be performed, for example, by a thermal process at a temperature from about 500° C. to about 1000° C., but preferably at a temperature of about 800° C. in an ambient of HCl gas with a flow rate from about 50 sccm to about 500 sccm for about 100 seconds to about 1000 seconds.

It should be noted that the gate electrode 112 and the gate dielectric 110 are supported along an axis orthogonal to the plane of FIG. 2. In other words, the gate electrode 112 extends over isolation regions (not shown) along an axis extending into and out of the page. In this manner, the gate electrode 112 bridges over the tunnel 212, supported on either end by STIs 104.

An optional anneal may be performed to facilitate silicon migration to repair any etch damage as well as to slightly smoothen the silicon surface for the subsequent epitaxy process.

Figure 3:
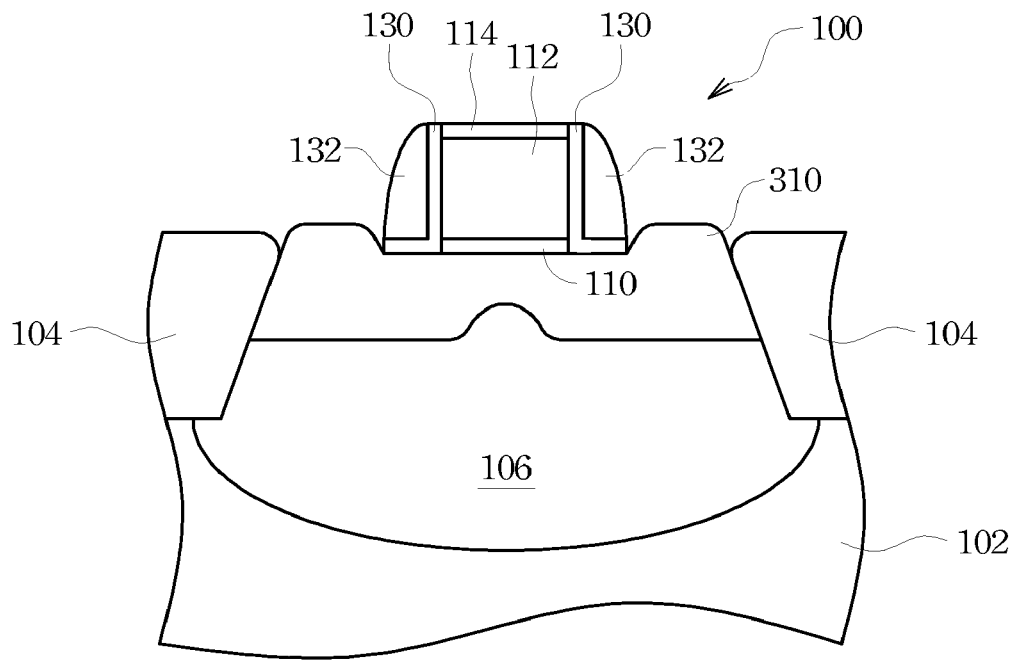

FIG. 3 illustrates the semiconductor device 100 after an epitaxial layer 310 is formed in accordance with an embodiment of the present invention. The epitaxial layer 310 preferably comprises a first semiconductor material and a second semiconductor material, wherein the second semiconductor material has a different lattice structure than the first semiconductor material, thereby imparting strain in the channel region. In an embodiment in which a silicon substrate is used, the first semiconductor material may be silicon and the second semiconductor material may be germanium, and therefore, the epitaxial layer 310 may be a SiGe layer. Other materials, however, may be used. The epitaxy process used to perform the epitaxial growth may be CVD, ultra-high vacuum chemical vapor deposition (UHV-CVD), or molecular beam epitaxy.

As illustrated in FIG. 3, the epitaxial layer 310 may be raised above a bottom surface of the gate insulator layer 110. Preferably, the epitaxial layer 310 is raised from about 0 Å to about 500 Å above the bottom surface of the gate insulator layer 110. In other embodiments, however, the epitaxial layer 310 is grown to about the same height as the bottom surface of the gate insulator layer 110 or recessed from about 200 Å to about 1200 Å below the bottom surface of the gate insulator layer 110.

Figure 4:
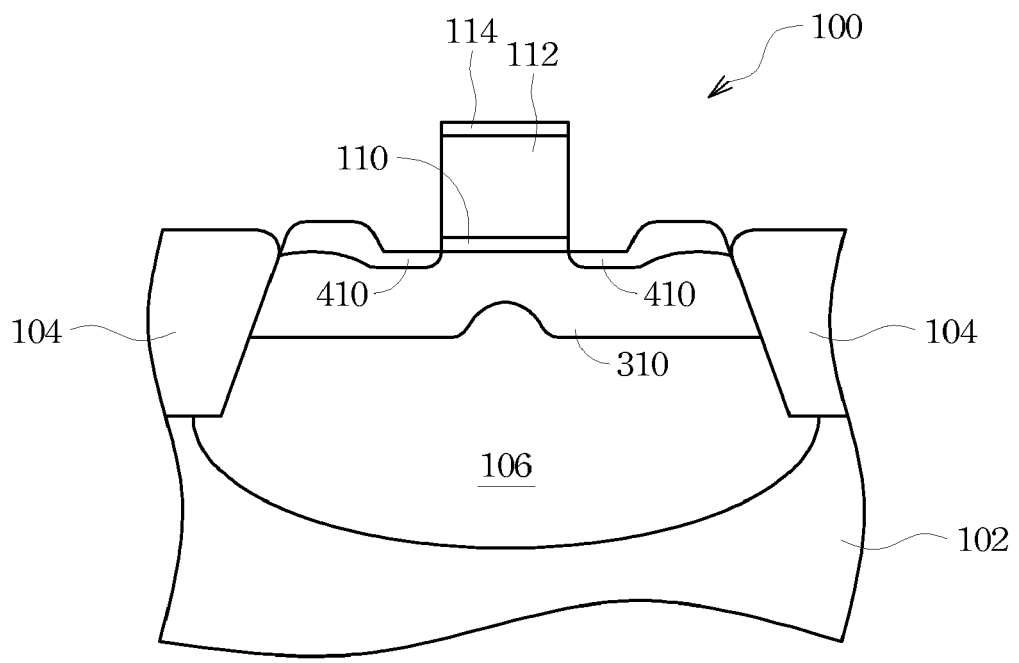

FIG. 4 illustrates the removal of the liners 130 and/or the first set of spacers 132 in accordance with an embodiment of the present invention. The liners 130 and/or the first set of spacers 132 may be removed in preparation for subsequently forming the source/drain regions, including the source/drain extensions. In an embodiment in which the spacers 132 are formed of $Si_3N_4$, the spacers 132 may be removed by, for example, an anisotropic dry etch process. Liners 130 formed of silicon dioxide may be removed by, for example, a wet etch process using a solution of diluted hydrofluoric acid. It should be noted, however, that in an embodiment the liners 130 may remain and the subsequent implant performed through the liners 130.

Thereafter, lightly-doped drains (LDDs) 410 are formed. The LDDs 410 may be formed, for example, by implanting P-type ions, such as boron or $BF_2$ ions, preferably at an energy between about 1 KeV and about 5 KeV at a dose between about 5e14 atoms/cm$^2$ and about 2e15 atoms/cm$^2$ to form a PMOS device, and implanting N-type ions, such as arsenic or phosphorous ions, preferably at an energy of about 0.5 KeV and about 3 KeV at a dose of about 5e14 atoms/cm$^2$ and about 2e15 atoms/cm$^2$ for an NMOS device. An anneal procedure, such as a rapid thermal anneal (RTA) procedure, may be employed to activate the implanted ions of the LDDs 410.

Figure 5:
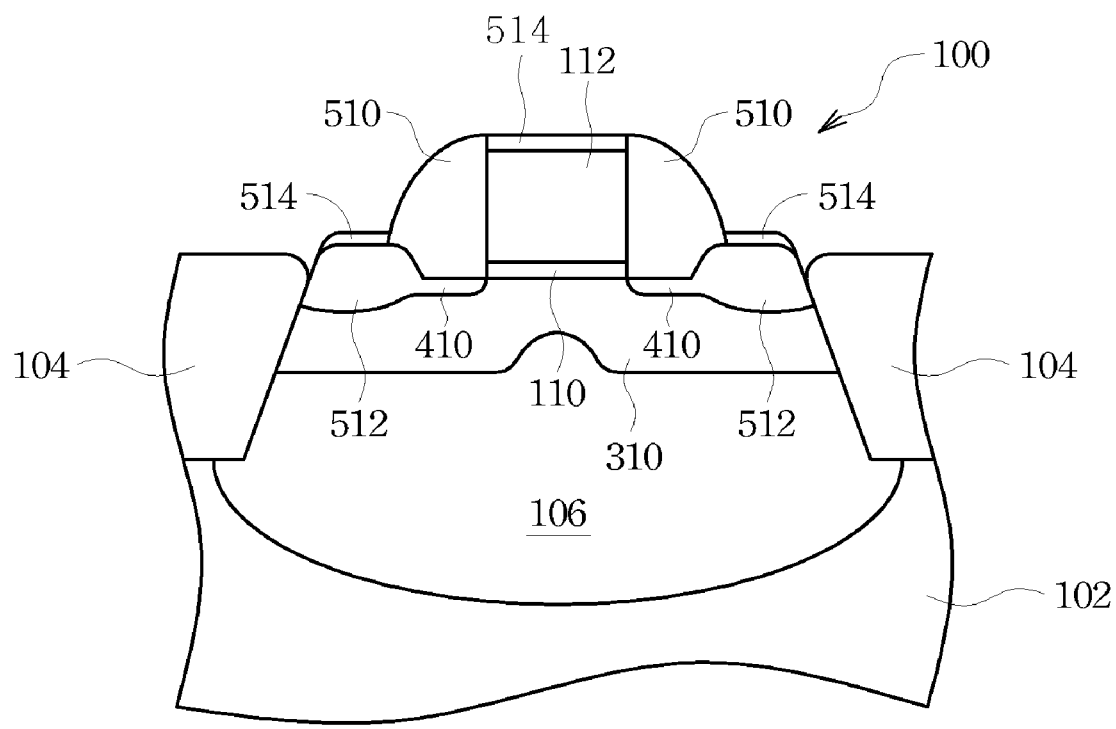

FIG. 5 illustrates formation of a second set of spacers 510 in accordance with an embodiment of the present invention. The second set of spacers 510 may be formed in a manner and of a material similar to the first set of spacers 132 discussed above with reference to FIG. 1. Accordingly, in an embodiment the second set of spacers 510 comprises silicon nitride deposited using LPCVD or PECVD procedures and patterned via a selective anisotropic RIE procedure, which may be performed using $Cl_2$ or $CF_4$. The second set of spacers 510 preferably has a width from about 300 Å to 600 Å, but more preferably about 450 Å. It should be noted that the second set of spacers 510 may include multiple spacers and/or liners. It should also be noted that the second set of spacers 510 may extend over a portion of the raised section of the epitaxial layer 310, as illustrated in FIG. 5.

FIG. 5 also illustrates the formation of heavily-doped source/drain regions 512 in accordance with an embodiment of the present invention. In an embodiment, P-type ions, such as boron or $BF_2$ ions, are implanted at an energy between about 1 KeV and about 15 KeV at a dose between about 1e13 atoms/cm$^2$ and about 5e15 atoms/cm$^2$ to create the heavily-doped source/drain regions 512 for a PMOS device, and N-type ions, such as arsenic or phosphorous ions, preferably at an energy of about 1 KeV and about 20 KeV at a dose of about 1e13 atoms/cm$^2$ and about 5e15 atoms/cm$^2$ to create the heavily-doped source/drain regions 512 for an NMOS device. An anneal procedure, such as a rapid thermal anneal (RTA) procedure, may be employed to activate the implanted ions of the source/drain regions 512.

Furthermore, FIG. 5 illustrates optional silicide areas 514 in accordance with an embodiment of the present invention. The silicide areas 514 may be formed, for example, by depositing a metal layer (not shown) such as titanium, nickel, tungsten, or cobalt via plasma vapor deposition (PVD) procedures. An anneal procedure causes the metal layer to react with gate electrode 112 and the source/drain regions 512 to form metal silicide. Portions of the metal layer overlying other areas, such as spacers 510 and STIs 104 remain unreacted. Selective removal of the unreacted portions of the metal layer may be accomplished, for example, via wet etch procedures. An additional anneal cycle may be used if desired to alter the phase of silicide areas 514, which may result in a lower resistance. The hard mask 114 is preferably removed prior to forming the silicide areas 514 on the gate electrode 112.

Figure 6A:
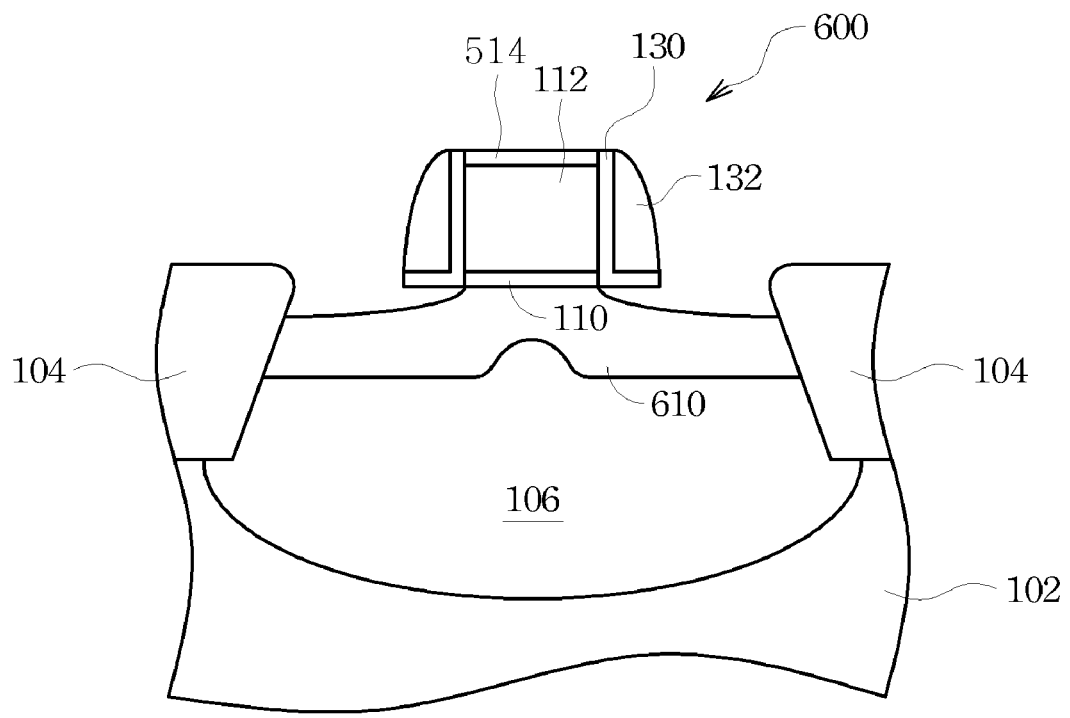
FIGS. 6a-7b illustrate various process steps for fabricating a semiconductor device having a stressed channel region in accordance with another embodiment of the present invention.

FIGS. 6a-7b illustrate another embodiment of the present invention in which multiple epitaxial layers are formed. Referring first to FIGS. 6a and 6b, semiconductor device 600 illustrates the semiconductor device 100 of FIG. 2, wherein like reference numerals refer to like elements, after a first epitaxial layer 610 has been formed in accordance with an embodiment of the present invention. In an embodiment, the first epitaxial layer 610 is in situ doped with N-type ions for a PMOS device and P-type ions for an NMOS device. For example, for fabricating a PMOS device, the first epitaxial layer 610 may be formed using phosphorous, or other N-type dopants, at a concentration from about 1E15 atoms/cm$^3$ and about 1E19 atoms/cm$^3$, and for fabricating an NMOS device, the first epitaxial layer 610 may be formed using boron, or other P-type dopants, at a concentration from about 1E15 atoms/cm$^3$ and about 1E19 atoms/cm$^3$. In this manner, the first epitaxial layer 610 in the channel region may have a reverse or opposite conductivity type as the source/drain regions.

It should be noted that the thickness of the first epitaxial layer 610 may be varied. For example, FIG. 6a illustrates an embodiment in which the first epitaxial layer 610 is formed to about the edge of the gate insulator layer 110 and/or the gate electrode 112. In another embodiment, such as that illustrated in FIG. 6b, the first epitaxial layer 610 is formed to correspond to about the edge of the first set of spacers 132. Due to the difficulty that may occur in controlling the formation of the first epitaxial layer 610 to the edge of the gate insulator layer 110 and/or the gate electrode 112, it may be preferable to form the first epitaxial layer to the edge of the first set of spacers 132 as illustrated in FIG. 6b.

Figure 6B:
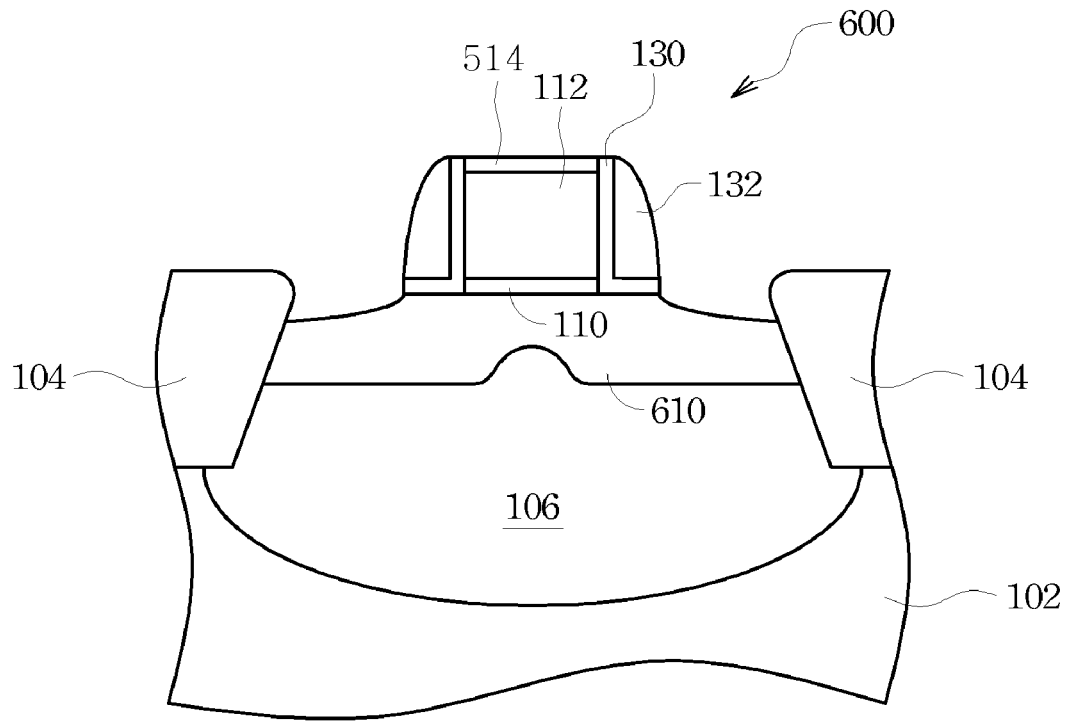
Figure 7A:
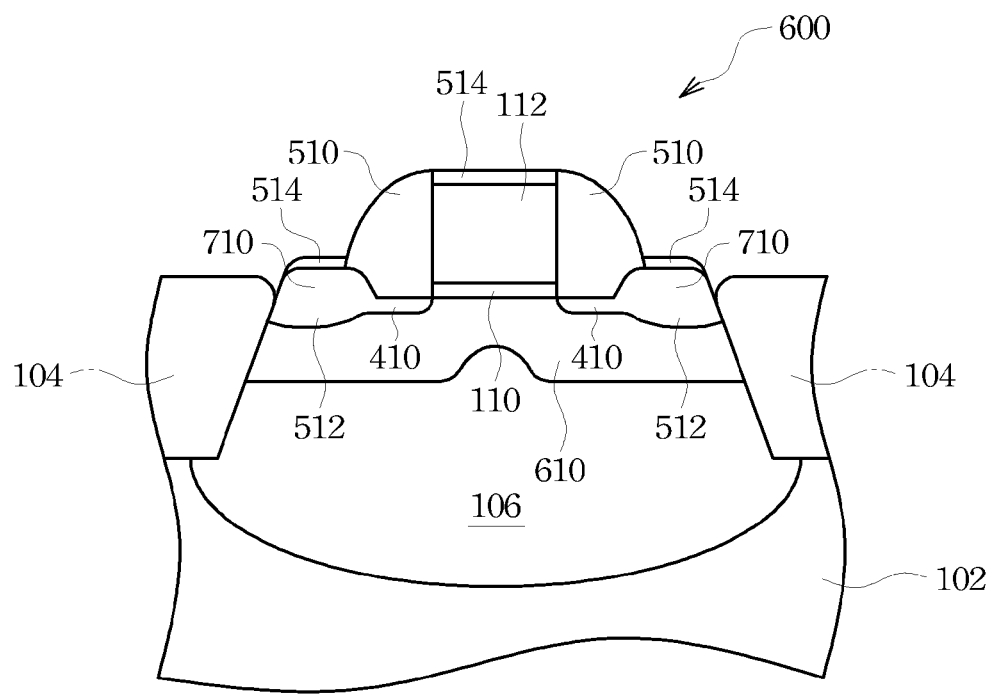
Figure 7B:
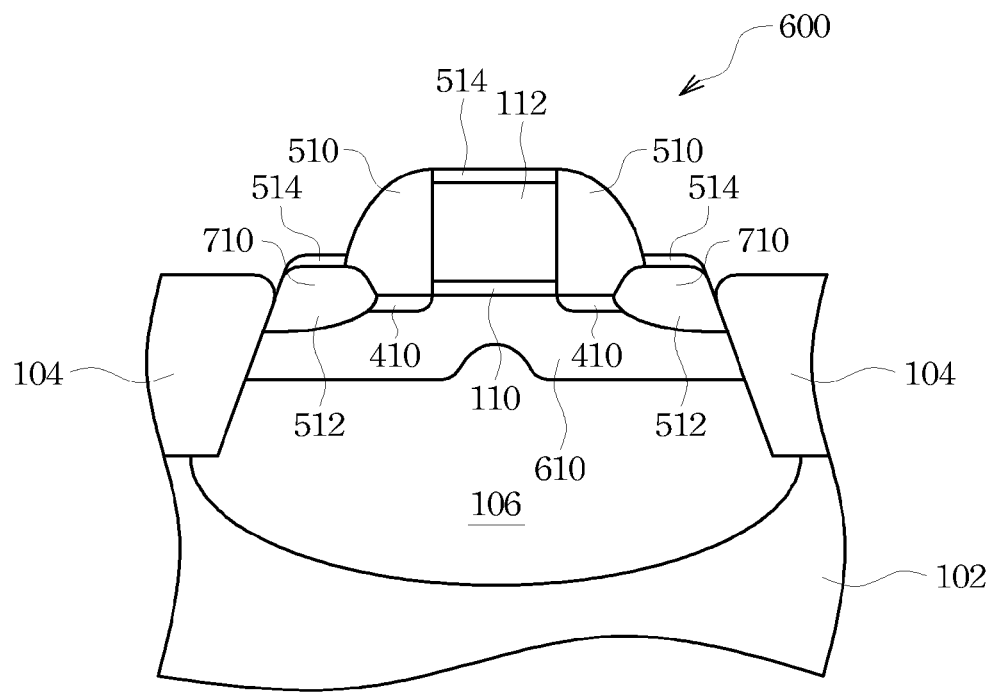

FIGS. 7a-7b illustrate the semiconductor device 600 of FIGS. 6a-6b, respectively, after a second epitaxial layer 710 is formed in accordance with an embodiment of the present invention. The second epitaxial layer 710 may be formed of the same type of material and in a similar manner as the first epitaxial layer 610. The second epitaxial layer 710, however, is preferably doped with P-type ions, such as boron, for a PMOS device and N-type ions, such as phosphorous, for an NMOS device. The second epitaxial layer 710 may be doped, for example, using an in situ doping process or an ion implantation process, such as that discussed above with reference to FIGS. 4 and 5.

Thereafter, the second set of spacers 510, the silicide areas 514, the LDDs 410, and the heavily-doped source/drain regions 512 may be formed as described above with reference to FIGS. 4 and 5.

In another embodiment, the second epitaxial layer 710 may be doped in situ. For example, for fabricating a PMOS device, the second epitaxial layer 710 may be formed by using in-situ with boron, or other P-type dopants, at a concentration from about 1E19 atoms/cm$^3$ and about 1E21 atoms/cm$^3$, and for fabricating an NMOS device, the second epitaxial layer 710 may be formed using phosphorous, or other P-type dopants, at a concentration from about 1E19 atoms/cm$^3$ and about 1E21 atoms/cm$^3$. In this manner, the first epitaxial layer 710 in the channel region may have a reverse or opposite type of conductivity.

It should be noted that the LDDs 410 may be optional in the embodiment illustrated in FIGS. 6a and 7a if an in situ implant is used in forming the second epitaxial layer 710. Separate LDDs, such as LDDs 410, are preferred, however, if the first epitaxial layer 610 extends to the edge of the first set of spacers 132 in order to provide the proper doping near the channel region.

Figure 8:
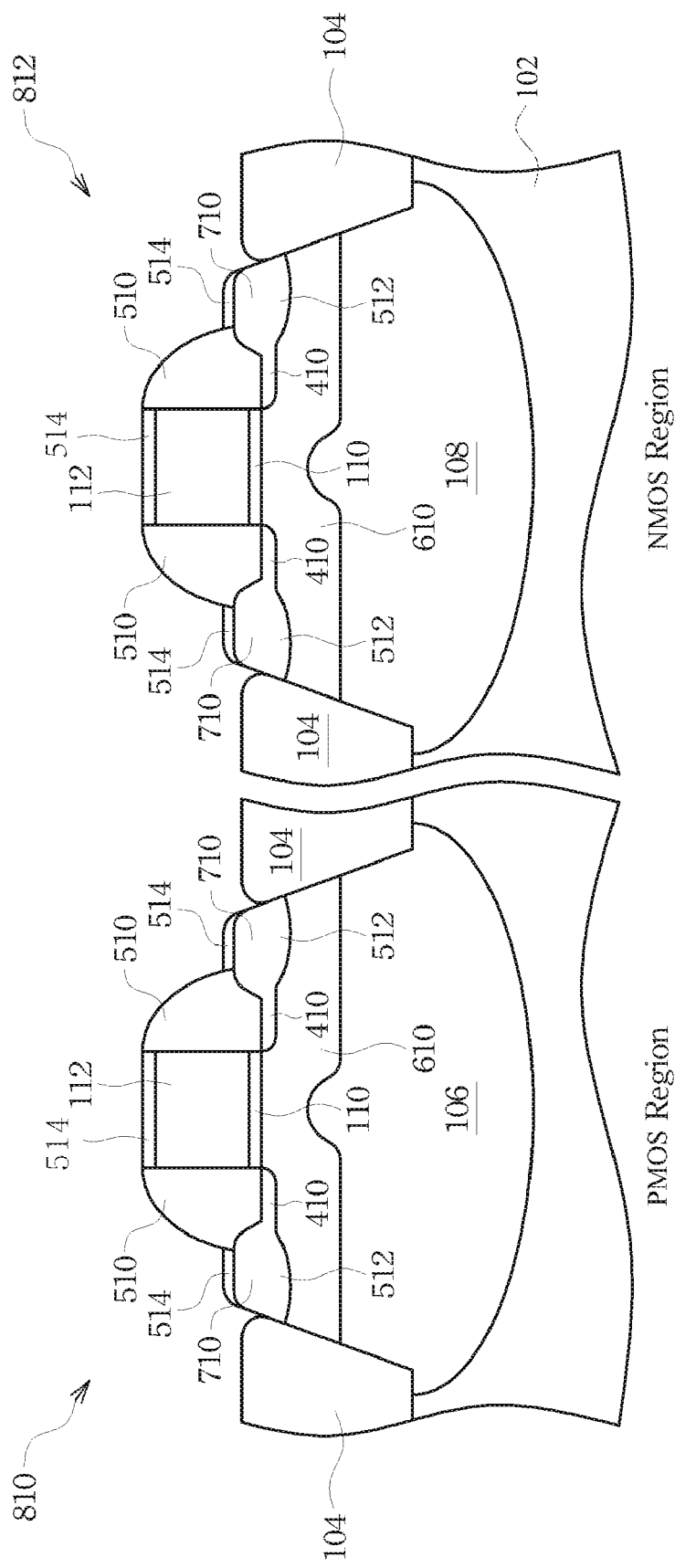
FIG. 8 illustrates an embodiment of the present invention in which a PMOS transistor and an NMOS transistor are formed on a single wafer in accordance with an embodiment of the present invention.

FIG. 8 illustrates an embodiment of the present invention in which a PMOS transistor 810 and an NMOS transistor 812 are formed on a single substrate in accordance with an embodiment of the present invention. One of ordinary skill in the art will realize that the processes described above may be utilized to fabricate both NMOS and PMOS transistors on a single substrate. It should be noted that FIG. 8 illustrates the PMOS transistor 810 having the same orientation as the NMOS transistor 812 for illustrative purposes only, and that the PMOS transistor 810 may have a different orientation or the same orientation as the NMOS transistor 812. In some cases, it has been found that the performance of the PMOS transistor 810 and the NMOS transistor 812 may be enhanced by orienting the current flow in the channel region of the PMOS transistor 810 and the NMOS transistor 812 in a specific manner with reference to the crystal orientation. Accordingly, it may be desirable to arrange the PMOS transistor 810 and the NMOS transistor 812 with reference to the crystal orientation to further enhance the performance of each transistor.

It should be noted that the first epitaxial layer 610 and the second epitaxial layer 710 may comprise different materials or the same materials in the PMOS transistor 810 and the NMOS transistor 812.

It should also be noted that FIG. 8 illustrates PMOS transistors and NMOS transistors formed by a process similar to that discussed above with reference to FIGS. 6a and 7a for illustrative purposes only. One of ordinary skill in the art will realize that other processes, such as those discussed above, may be used as well.

One of ordinary skill in the art will realize that additional masks may be used to protect one of the NMOS region and the PMOS region while processing is being performed on the other of the NMOS region and the PMOS region.

As one of ordinary skill in the art will appreciate, the formation of germanium oxide under the gate electrode is avoided by forming and patterning the gate dielectric and gate electrode prior to forming the silicon germanium. This is accomplished in part by tunneling under the gate dielectric and gate electrode and then subsequently growing the germanium epitaxial layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal-oxide-semiconductor field-effect transistor (MOSFET) comprising:
   a semiconductor substrate;
   a gate dielectric on the semiconductor substrate;
   a gate electrode on the gate dielectric;
   an epitaxial layer in the semiconductor substrate, a portion of the epitaxial layer being under and next to the gate dielectric, the epitaxial layer comprising a source region, a drain region, and an under-gate region, the under-gate region of the epitaxial layer having a varying thickness, the epitaxial layer in the source region and the drain region having a transition region where an upper surface of the epitaxial layer in the source region and the drain region transitions from a first height to a second height; and
   a dielectric spacer adjacent to the gate dielectric and the gate electrode, the dielectric spacer extending over the transition region.

2. The MOSFET of claim 1, wherein a portion of the epitaxial layer nearest a center between the source region and the drain region has a minimum thickness.

3. The MOSFET of claim 1, wherein the under-gate region of the epitaxial layer has a maximum thickness of about 1000 Å.

4. The MOSFET of claim 1, wherein the epitaxial layer comprise a silicon germanium (SiGe) layer.

5. The MOSFET of claim 1, wherein a top surface of the epitaxial layer in the source region and the drain region is higher than a bottom surface of the gate dielectric.

6. The MOSFET of claim 5, wherein the top surface of the epitaxial layer in the source region is about 500 Å higher than the bottom surface of the gate dielectric.

7. The MOSFET of claim 1, wherein a top surface of the epitaxial layer in the source region and the drain region is lower than a bottom surface of the gate dielectric.

8. The MOSFET of claim 7, wherein the top surface of the epitaxial layer in the source region is about 200 Å to about 1200 Å lower than the bottom surface of the gate dielectric.

9. The MOSFET of claim 1, wherein the epitaxial layer further comprises lightly-doped drains (LDDs).

10. A metal-oxide-semiconductor field-effect transistor (MOSFET) comprising:
   a semiconductor substrate;
   a gate dielectric on the semiconductor substrate;
   a gate electrode on the gate dielectric;
   a first epitaxial layer in the semiconductor substrate, at least a portion of the first epitaxial layer being under and proximate to the gate dielectric, the first epitaxial layer comprising a first region, a second region, and an under-gate region interposed between the first region and to the second region, the first epitaxial layer having a varying thickness;
   a second epitaxial layer above the first epitaxial layer, the second epitaxial layer having a non-planar surface with at least one lower top surface and at least one upper top surface; and
   a dielectric spacer adjacent to the gate dielectric and the gate electrode, the dielectric spacer extending over an interface between the at least one lower top surface and the at least one upper top surface.

11. The MOSFET of claim 10, wherein the first and second epitaxial layers are doped with opposite conductivity type impurities.

12. The MOSFET of claim 10, wherein the first epitaxial layer fills the under-gate region between edges of the gate dielectric.

13. The MOSFET of claim 10, further comprising a gate electrode on the gate dielectric and spacers adjacent to the gate electrode and the gate dielectric.

14. The MOSFET of claim 13, wherein the first epitaxial layer fills a region defined by outer edges of the spacers and the semiconductor substrate.

15. The MOSFET of claim 14, further comprising lightly-doped drains (LDDs) in the first epitaxial layer.

16. The MOSFET of claim 10, wherein the MOSFET comprises no germanium oxide.

17. The MOSFET of claim 10, wherein the first epitaxial layer and the second epitaxial layer comprise different materials.

18. The MOSFET of claim 10, wherein the first region and the second region are on opposing sides of the gate dielectric and have a depth from about 600 Å to about 800 Å.

19. The MOSFET of claim 10, wherein the second epitaxial layer is doped and the first epitaxial layer is undoped.

20. The MOSFET of claim 10, wherein the first epitaxial layer comprises silicon and germanium.

* * * * *